US008228684B2

(12) United States Patent
Losavio et al.

(10) Patent No.: US 8,228,684 B2
(45) Date of Patent: Jul. 24, 2012

(54) MULTI CHIP ELECTRONIC SYSTEM

(75) Inventors: Aldo Losavio, Bergamo (IT); Giovanni Campardo, Bergamo (IT); Stefano Ricciardi, Milan (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 1049 days.

(21) Appl. No.: 12/116,852

(22) Filed: May 7, 2008

(65) Prior Publication Data

US 2008/0278923 A1    Nov. 13, 2008

(30) Foreign Application Priority Data

May 8, 2007    (IT) .............................. MI2007A0933

(51) Int. Cl.
  *H05K 1/11* (2006.01)
  *H05K 1/14* (2006.01)
(52) U.S. Cl. ........ 361/803; 361/829; 257/686; 257/685; 257/777; 257/723

(58) Field of Classification Search .................. 361/803, 361/829; 257/686, 685, 777, 723
See application file for complete search history.

(56) References Cited

U.S. PATENT DOCUMENTS

| 6,404,043 | B1 * | 6/2002 | Isaak | 257/686 |
| 2007/0109831 | A1 * | 5/2007 | RaghuRam | 365/63 |

* cited by examiner

*Primary Examiner* — Yuriy Semenenko
*Assistant Examiner* — Andargie M Aychillhum
(74) *Attorney, Agent, or Firm* — Wolf, Greenfield & Sacks, P.C.

(57) ABSTRACT

An electronic system adapted to perform a corresponding function and including at least a first subsystem and a second subsystem, the first subsystem and the second subsystem being operatively couplable to each other through a plurality of electric connections to perform the function of the system, in which the first subsystem and the second subsystem are respectively integrated on a first material chip and on a second material chip, the plurality of electric connections including a plurality of conductive through holes formed in at least one of the first and second chips and adapted to form a corresponding plurality of inter-chip electric connections when the first and the second chips are superimposed.

22 Claims, 6 Drawing Sheets

MULTI CHIP ELECTRONIC SYSTEM

BACKGROUND OF THE INVENTION

1. Field of the Invention

The present invention concerns electronic systems in general, and particularly electronic systems realized in the form of Integrated Circuits ("IC"), integrated in two or more chips.

2. Discussion of the Related Art

"Multi-Chip Modules" or MCM, also known as SIP ("System-in-Package", i.e. electronic systems contained in a single package) are known in the art, that include two or more ICs, constituting respective sub-systems of the electronic system, integrated in respective chips and contained in a single package.

The SIPs are often used in alternative to systems denominated SOCs, ("System-On-Chip", i.e. whole electronic systems integrated on a single chip), in which all the circuital parts that compose of the electronic system to be realized are integrated in a single chip.

In an SOC, the IC integrated in the single chip can for instance include a microcontroller or a microprocessor, and/or a Digital Signals Processor (DSP), a memory constituted by one or more memory blocks of various type, such as for example Read Only Memories (ROM), Random Access Memories (RAM), and non-volatile memories, for instance of Flash type, to store the program that is to be executed, for example, by the microcontroller that governs the operation of the SOC, as well as blocks of management of the power supply (like, for instance, voltage regulators and charge pumps) and all the circuits that enable the communication of the IC with the outside.

Various types of SOCs are available in commerce, such as custom-designed ("full custom") SOCs or SOCs with programmable functionality, programmable by an external user (like for instance in the case of "Field Programmable Gate Arrays", FPGAs). In any case, the SOCs are normally realized by integrating the circuit components on the single chip using a single, very complex manufacturing process flow, because it has to include all the phases necessary to the realization of components very different from one another.

The complexity of the manufacturing process constitutes a disadvantage of the SOCs, that has a significant impact in terms of achievable yield in manufacturing process. Additionally, the SOCs of "full custom" type exhibit a high cost of development, which substantially impacts on the total production costs of the implemented electronic system.

The SIPs do not exhibit the above-mentioned drawbacks, since, as mentioned, they comprise two or more chips, in each of which a respective IC is integrated, by means of an ad-hoc manufacturing process, adapted in use to perform its own function, independently from that of the ICs integrated in the other chips contained in the same package. For instance, in a chip the microcontroller or the microprocessor or the DSP is integrated, in another chip the RAM is integrated, in still another chip the ROM or the Flash memory is integrated.

In a SIP, every IC includes a functional circuit core adapted to implement the specific functionality required to that IC, but a high number of service circuit structures is also integrated in every chip, that interact with the functional circuit core.

For example, in the case of a microcontroller, the functional circuit core is constituted by the central processing unit (the so-called CPU), in the case of a memory device, the functional circuit core includes a memory cells matrix; still in the case of a memory, the service circuit structures include all the circuit components adapted to manage the operations to be performed by the memory device, typically data read operations and, where the memory is programmable, data write and erase operations; typically the service structures include for example the charge pumps adapted to generate the operational voltages used during the write/erase operations on the memory, the decoding circuits for accessing the memory cells and the input and output buffers used for interfacing the chip with the external environment. In the case the IC is a microcontroller, the service circuit structures also include the input/output buffers.

The Applicant has observed that the integration, on every chip, of the service circuit structures, is disadvantageous in general, since it leads to an increase in area of material, and this is particularly true in systems to be used in portable apparatuses (like, for instance, in MP3 devices and in cellular phones), in which it is important to reduce the space occupation.

Additionally, it often happens that the service circuit structures are designed to satisfy less stringent requirements compared to those required to the functional circuit cores of the ICs. In other words, the service circuit structures are realized with design rules and manufacturing process different from, being more relaxed, those related to the functional cores; integrating on a same chip both the functional cores and the service circuit structures of the ICs has the result that the lithographic apparatuses used during the production process are not exploited at the best of their possibilities: often in fact in an IC a 50% thereof is represented by the service circuit structures.

SUMMARY OF THE INVENTION

The Applicant has found that a possible solution to the outlined problems including integrating an electronic system on different chips, separating the sub-systems that compose it, and possibly parts of the sub-systems themselves, and integrating on a same chip that or those sub-systems that, for their structural and/or functional nature, can be shared by two or more other sub-systems.

For instance, according to an embodiment of the present invention, the service circuit structures that are normally integrated in different chips, being on every integrated IC chip exclusively devoted to the functional circuit core on such chip, are instead at least partially integrated on one or more separate chips and shared by two or more ICs of the electronic system.

In this way, not only it is possible to save area, inasmuch the necessity of duplicating circuit structures is avoided, or however it is reduced, but it is also possible to exploit to the best the lithographic apparatuses; in fact, the most sophisticated and expensive apparatuses can mostly be devoted to the integration of the sub-systems designed with more stringent rules, such as for instance the memory matrices, while for the realization of the ICs devoted to service circuit structures, that are designed with more relaxed rules, apparatuses of preceding generations can be employed, whose cost has already been amortized.

Particularly, the present invention provides a solution as set forth in the independent claims.

Advantageous embodiments of the invention are set forth in the dependent claims.

In detail, an aspect of the present invention proposes an electronic system adapted to perform a corresponding function and comprising at least a first subsystem and a second subsystem. The first subsystem and the second subsystem are operatively couplable to each other through a plurality of electric connections to perform the function of the system. The first subsystem and the second subsystem are respectively integrated on a first material chip and on a second material chip, and said plurality of electric connections includes a plurality of conductive through holes realized in at least one of said first and second chip and adapted to form a corresponding plurality of inter-chip electric connections when the first and the second chip are superimposed.

BRIEF DESCRIPTION OF THE DRAWINGS

These and other aspects, and advantages of the present invention will be made clear from the following detailed description of one embodiment thereof, provided purely by way of non-limitative example, description that will be conducted making reference to the attached drawings, wherein.

DETAILED DESCRIPTION

Figure 1:
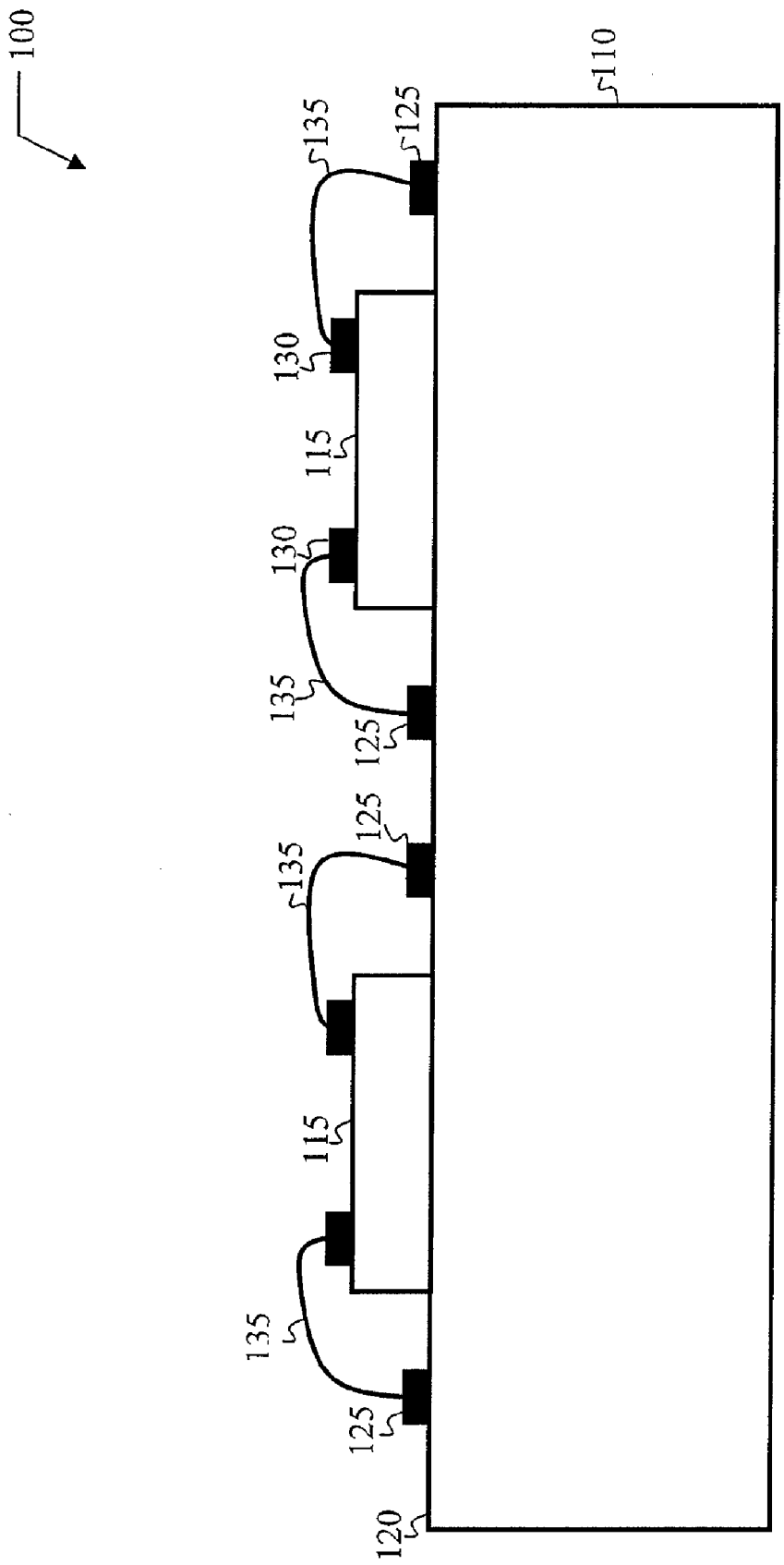
FIG. 1 shows a conventional SIP.

In the following description, similar or identical elements in the drawings are denoted with the same references numerals.

With reference to FIG. 1, a conventional SIP 100 is shown. The SIP 100 includes a chip support or "chip carrier" 110, two (as in the example) or more chips 115, that are placed on the upper surface 120 of the support 115; an encapsulation layer (not shown in the figure) covers two (or more) chips 115, encapsulating them. The support 110 includes a plurality of contact pads 125. The chips 115 also include a plurality of contact pads 130, that are electrically connected to the contact pads 125 of the support 110 through conductive wires 135.

Every chip 115 integrates a respective IC that in use is adapted to perform its own function, thus implementing different sub-systems of the overall electronic system.

To this purpose, every IC integrated in one of the chips 115 includes a functional circuit core, adapted to implement the functionality required to the IC, and a high number of service circuit structures, that manage the various operations on the same chip, interacting with the functional circuit core.

In the considered example, referring to an electronic system comprising two memory ICs, in the memory IC integrated on the generic chip 115 the functional circuit core comprises a matrix of memory cells while the service circuit structures include all the circuits adapted to manage the operations of reading and, where provided for, writing and erasing of the data, to be performed on the memory device; for example, the service circuit structures typically include charge pumps adapted to generate the operational voltages used during the write/erase operations on the memory, the circuits for decoding the addresses to access the memory cells and the input and output buffers used for interfacing the individual chip with the external environment. This causes a significant increase in the area occupied by each chip 115, because several circuit structures are duplicated, and also the problems of scarce efficiency of the manufacturing process as underlined in the foregoing.

Additionally, each conductive thread introduces parasitic effects (such as parasitic capacitances) that cause a significant reduction of the frequency of the signals used during the operation of the electronic system, thereby penalizing its overall performances.

The ICs integrated in the chips 115 can be for example realized using a Complementary MOS (CMOS) technology capable of realizing MOS transistors with minimum channel length equal to 90 nm. During the manufacturing process of the device, and particularly during the phase in which the process of micrometric lithography is performed, only the memory cells matrix actually requires an advanced process of micrometric lithography capable of impressing on the semiconductor material wafer geometries of minimum size (in the considered example, 90 nm). On the contrary, in the remaining part of the memory (i.e. the part of the service circuit structures) the devices are realized with significantly greater minimum dimensions (for example, 200 nm) compared to those used for the memory cells matrix. In such a case, since the structure of the memory device is impressed in a single process phase, the resolution capabilities of the lithographic apparatuses are not efficiently exploited, thereby significantly increasing the production costs of the memory device.

Similar considerations hold true for the process phases in which the oxide diffusion processes are performed. In the IC integrated in the generic chip 115, the service structures are implemented using MOS transistors with oxides having a thickness of about an order of magnitude lower in comparison to that of the transistors used for implementing the memory cells. For example, the decoding circuits and the input/output buffers can include transistors having oxides with thickness that vary between 3 nm and 4 nm, while the oxides used for the memory cells have thickness of about 10 nm. In this case, during the manufacturing process, for every memory device both the types of oxides have to be formed on the whole area of the semiconductor wafer, and then they need to be removed from where they are not necessary, increasing the complexity and the costs of the manufacturing process and penalizing the final yield of the implemented electronic system.

According to an embodiment of the present invention, the above-mentioned problems are at least partially solved thanks to an approach that substantially is the opposite to that adopted in SOCs.

Figure 2:
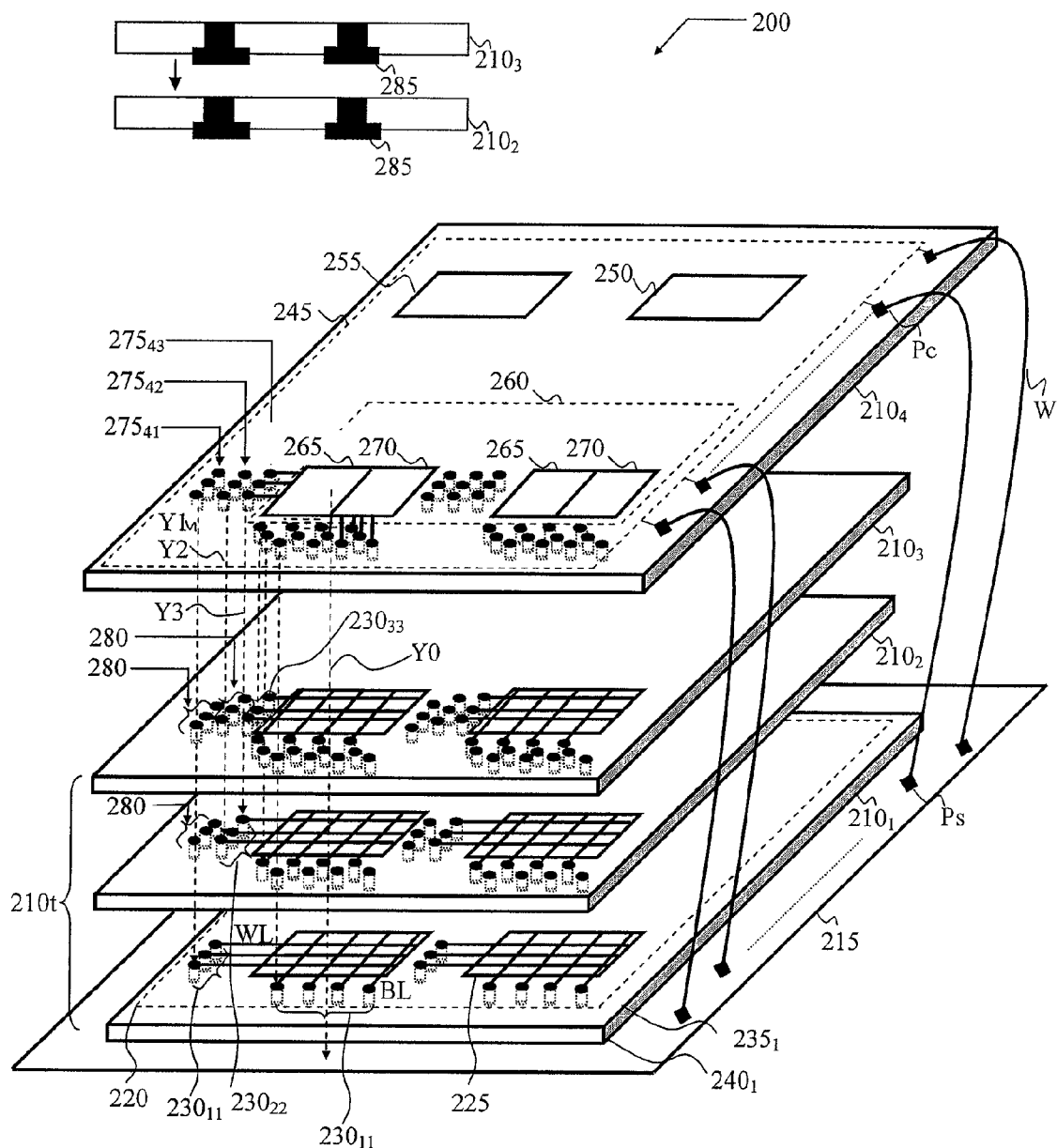
FIG. 2 schematically shows an electronic system according to an embodiment of the present invention.

With reference to FIG. 2, an exemplary electronic system 200 according to an embodiment of the present invention is shown, comprising a plurality of two or more ICs, integrated on two or more respective chips $210_i$ (for i=1 . . . n, in the shown example n=4). The chips $210_i$ are in particular stacked one onto the other, and they are preferably mounted on a chip support 215 (for example, multi-layer substrate comprising several layers formed with different materials, like plastic, ceramic or laminated materials, for example of the type used in the known packaging technique called "Ball Grid Array" or BGA). To such end, one among the chips $210_i$ of the plurality, that is located at the top of the stack of chips $210_i$, includes for example contact pads Pc that are connected through connection wires W to a corresponding plurality of contact pads Ps provided on the support 215.

On every chip 210i respective ICs are integrated, that can include analog and/or digital circuits, and that implement different sub-systems of the general electronic system 200. In an embodiment of the present invention, the IC integrated on the generic chip $210_i$ is fabricated through a dedicated process flow optimized for the fabrication of that IC. The different chips 210i, each with integrated the respective IC, are then assembled together to form the electronic system 200. It is observed that, in some embodiments of the present invention, two or more chips $210_i$ of the plurality can integrate similar or identical ICs, from the functional point of view, realized using the same manufacturing process flow.

In the following description, the index used for designating the chips $210_i$ that are stacked one onto the other is assumed to increase in departing from the support 215 (that is, from the bottom upwards).

In the herein considered exemplary embodiment of the invention, the plurality of (two or more) stacked chips $210_i$ in which there are integrated the ICs that constitute the overall electronic system 200 includes a chip, in the example the chip $210_4$, placed at the top of the stack, or in general at an end of the stack of chips, and one or more chips, altogether denoted with $210_r$, in the example the chips $210_1$-$210_3$, stacked between the support 215 and the end chip $210_4$.

For instance, the electronic system 200 is a memory device comprising several memory ICs; however, this is not to be intended as limitative to the present invention, since the solution according to the present invention can be applied to any other electronic system implemented using two or more chips (such as, for instance, electronic systems comprising microprocessors, microcontrollers, DSPs, as well as any combination of analog and digital ICs, for instance radiofrequency transceiver ICs in combination with memory ICs and/or microcontrollers, microprocessors, DSP ICs).

On every chip, not only electronic circuits can be integrated, but in general systems of various nature (micromechanical systems, microelectro-mechanical systems and electronic systems), such as MEMS ("Micro Electro-Mechanical System") and MOEMS ("Micro Opto-Electro-Mechanical System"), that combine the electrical/electronic properties of the semiconductor ICs with mechanical, electromechanical and also optical properties. MEMS or MOEMS for applications of projection of images in applications of digital processing thereof can for example be integrated on one or more chips. In such a case, the MEMSs or MOEMS integrated on the chip comprises the elements (like matrixes of mobile micro-mirrors) that are used for driving, filtering and possibly amplifying the light so that a color image can be obtained.

However, in the following of the description, for brevity it will be assumed that in the various chips $210_i$ only electronic ICs are provided, and particularly, as already mentioned, IC adapted to provide altogether a memory device.

The ICs integrated in the chips $210_i$ belonging to the plurality $210_r$ of the memory device 200, in the example the chips $210_1$-$210_3$, include matrixes 220 of memory elements or cells, for instance non-volatile memory elements, for example of the Flash type. More in detail, the Flash type memory elements that form the memory matrix 220 integrated in every chip $210_i$ are for instance electrically programmable memory elements, and each memory element can for instance include a floating gate MOS transistor, that stores a logical value defined by its threshold voltage (which depends on the electric charge stored in its floating gate). In alternative embodiments, the non-volatile memory elements can be different, for instance ferroelectric elements, or phase-change elements, or combinations thereof, or they may be volatile memory elements, for instance DRAM or SRAM memory cells.

The memory matrices 220 integrated on the generic chip of the plurality $210_r$ are, in the herein considered example, divided in two, or more, sub-matrixes or memory sectors 225. The sectors 225 can for instance be individually addressable. For example, in case the memory ICs integrated on the chips of the plurality $210_r$ are of the Flash type, which as known do not allow the erasure of individual memory elements, the generic sector 225 can represent the block of memory cells that can be erased at a time.

In detail, in the generic memory sector 225 the memory cells are organized in a plurality of rows, each one connected to a corresponding word line WL, and in a plurality of columns, each one connected to a corresponding bit line BI.

According to an embodiment of the present invention, in the IC integrated on the generic chip $210_i$ belonging to the plurality $210_r$, the word lines WL and the bit lines BL of each sector 225 in which the matrix 220 is subdivided are connected, through conductive strips, in metal or in polysilicon or other material, to a corresponding group of conductive through holes ("through vias") $230_{in}$ (in the example at issue n=1 . . . 3); every through hole electrically connects an upper surface $235_i$ of the chip $210_i$ of the plurality $210_r$ to a lower surface $240_i$ of the same chip $210_i$.

The through holes $230_{in}$ can be provided forming a sufficiently deep excavation to pass through the chip, subsequently filled with conductive material (for example, Cu). A possible technique for forming the through holes $230_{in}$ is for example described in K. Takahashi et al., "Process Integration of 3D Chip Stack with Vertical Interconnection". Particularly, the excavations adapted to form the conductive through holes $230_{in}$ are provided by etching a substrate of the chip $210_i$ starting from its upper surface $235_i$, until a level corresponding to the lower surface $240_i$ is reached. The walls of the excavations are subsequently covered by a layer of dielectric, and they are finally filled with the selected conductive material. The substrate is then planarized, up to uncover the bottom of the excavations, so as to form an electric contact between the upper surface $235_i$ and the lower surface $240_i$ of the chip $210_i$. With this technique, conductive through holes can be provided, for instance of square shape, with side of the order of 10 μm spaced apart of a pitch of the order of 20 μm. However, in alternative embodiments of the present invention, the conductive through holes $230_{in}$ can be of different shape and their size and pitch provided above are to be intended as only exemplary, since other values of such quantities are possible.

The chip $210_4$ (which, in the considered example, occupies the position at the top of the stack of chips $210_i$) includes service circuit structures 245, comprising the circuits used for the management of the memory device 200 and the circuits of interface with the external environment. The service circuit structures 245 include in particular a power management unit 250, a control unit 255 and a decoding system 260. Particularly, the power management unit 250 is adapted to provide the bias voltages used for the management of the various operations on the memory device 200 (for instance, voltages from 1V to 13V) while the control unit 255 is adapted to provide the control signals that serve for driving the various sub-systems of the memory device 200.

The decoding system 260 is used for accessing the memory cells in response to an address code received from outside the memory device 200, and it comprises a plurality of row address decoding and selection blocks 265 and a plurality of column address decoding and selection blocks 270, respectively used for the selection of the word lines WL and of the bit lines BL of the memory sectors 225. In an embodiment of the present invention, the row address decoding and selection blocks 265 and the column address decoding and selection blocks 270 associated with the sectors 225 placed along a same line Y0 in the stack of chips $210_i$, are also placed along the line Y0. Nevertheless, in alternative embodiments of the invention the row address decoding and selection blocks 265 and the column address decoding and selection blocks 270 may occupy different positions.

To access the memory cells belonging to the sectors 225, each row address decoding and selection block 265 comprises a plurality of row decoding and selection signal terminals electrically connected, through conductive strips, in metal or in polysilicon or other material, to a corresponding group of conductive through holes $275_{in}$ formed in the chip $210_4$ (such through holes have, for example, characteristics similar to those of the through holes $230_{in}$). Likewise, every column address decoding and selection block 270 comprises a plurality of column decoding and selection signal terminals connected correspondingly through holes $275_{in}$ formed in the chip $210_4$. Each through hole $275_{in}$ connected to a respective terminal of the plurality of row decoding and selection signal terminals is electrically connected to a corresponding word line WL of a memory sector 225 integrated in one of the chips $210_i$ of the plurality $210_t$, through a conductive path (that in the following is also referred to as "inter-chip connection") that uses the through holes $230_{in}$ formed in the chips $210_i$ of the plurality of chips $210_t$. Likewise, each through hole $275_{in}$ connected to a respective terminal of the plurality of column decoding and selection signal terminals is electrically coupled to a corresponding bit line BL of a memory sector 225 integrated in one of the chips $210_i$ of the plurality $210_t$, through an inter-chip connection that uses the through holes $230_{in}$. It is noted that, to form inter-chip connections between non-adjacent chips, for instance the chip $210_1$ and the chip $210_4$, intermediate through holes 280 are provided for, having for example characteristics similar to those of the through holes $230_{in}$ and formed in suitable positions in the intermediate chip or chips between the two non-adjacent chips to be connected, such as, in the shown example, the chips $210_2$ and $210_3$.

Particularly, the inter-chip connections, for instance for connecting the row and/or column selection signal terminals formed on the chip $210_4$ to the word lines WL and, respectively, the bit lines BL on the chip $210_1$, are provided using the through holes $275_{41}$ in the chip $210_4$, the intermediate holes 280 in the chips $210_3$ and $210_2$ and the through holes $230_{11}$ in the chip $210_1$, so as to form a conductive path that provides the electrical connection between the service circuit structures 245 and the memory sectors 225.

In alternative embodiments, the chip $210_1$ that is in contact with the support 215 may comprise simple superficial contact areas (without conductive through holes) used for contacting the conductive through holes formed in the chip $210_4$, so as to receive the operational signals.

In FIG. 2 there are indicated in dashed style lines Ym (in the considered example, m=1 . . . 3) along which the inter-chip connections between every through hole belonging to the group of through holes $230_{in}$ and the corresponding through hole belonging to the group of through holes $275_{in}$ are realized. Similar considerations applies for the bit lines BL, each of which is connected to the decoding system 260 through a conductive path using corresponding through holes aligned to one another and connected to form a conductive path.

It is noted that, considering a generic word line WL of the generic sector 225 of a generic chip $210_i$ belonging to the plurality $210_t$, for example the chip $210_1$, the electric inter-chip connection allows to connect electrically the word lines WL related to the sector 225 to the decoding system 260. In this way, the management of the operations to be performed on the memory cells is entrusted to the service circuit structures integrated in the chip $210_4$, and it is not necessary to provide service circuit structures locally integrated on every one of the chips belonging to the plurality $210_t$. Particularly, according to an embodiment of the present invention, the duplication of the service circuit structures is reduced, so that not only it is possible to save chip area, but it is also possible to exploit to the best the photolithographic apparatuses used for integrating the different sub-systems of the electronic device 200; in fact, the most sophisticated and expensive apparatuses can mostly be devoted to the integration of the memory matrices, that as known use higher integration scale and more stringent design rules compared to the parts that realize the service circuits; for the realization of the ICs devoted to the service circuit structures, that are designed with more relaxed rules, apparatuses of the preceding generation can be employed.

In order to be able to univocally select the memory sectors 225, the position of every chip $210_i$ within the stack is such as to provide the correspondence between the through holes $230_{in}$, the through holes 280 and the holes $275_{in}$ along the shown directions; in other words, the through holes 230 in that connect a word line WL and/or a bit line BL with the decoding system 260 are positioned within every chip $210_i$ in such a way as not to coincide with the respective through holes related to a different word line and/or bit line, both belonging to the same sector and belonging to different sectors.

The number of through holes formed in the generic chip $210_i$, progressively increases starting from the chip $210_1$, distal compared to the chip $210_4$ and, in the shown example, located at the bottom of the stack of chips, up to the chip $210_4$ at the top of the stack of the chips $210_i$. Particularly, since the inter-chip electric connections allow to electrically connect the service structures 245 with the word lines WL and the bit lines BL, the number of through holes provided in the chip $210_4$ corresponds to the sum of the number of word lines WL and of bit lines BL provided for in the memory device 200.

In the example at issue, to provide the inter-chip electric connections between the through holes along the lines Y1-Y3 different techniques can be used, like, for instance, processes of inter-chip connection that use bump-bonding, for example of Cu.

In FIG. 2, there is also shown by way of example the enlarged detail of a portion of inter-chip electric connection between through holes of two chips $210_i$, for example the chips $210_2$ and $210_3$. To connect to each other the through holes belonging to the two chips, on the upper chip $210_3$ (closer to the chip $210_4$) contact pads 285 are realized, for instance in Cu, which, when submitted to suitably high temperatures (for example, 350° C.) for a predetermined time interval (for example, 60 s) partially melt, directly attaching to the conductive layer that coats the through holes of the underlying chip $210_2$, thus providing the desired inter-chip electric connection.

The chips $210_i$ can for instance have a thickness equal to 50 μm and can for example be spaced apart a distance equal to 10 μm. Particularly, the space between two generic chips $210_i$ can be filled with a dielectric material, for example low-viscosity resin.

In further embodiments of the present invention, the chip integrating the service circuit structures 245 can occupy the lowest position in the stack of chips (that is, the position closest to the support 215). In this case, the lower surface $240_4$ of the chip $210_4$ is electrically connected to its upper surface $235_4$ through groups of through holes that are directly attached to the contact pads of the support 215 using contact pads, for instance in Cu, without the necessity to provide the connection wires W to the pads Ps.

According to an embodiment of the invention, the use of the through holes allows to connect ICs integrated in more chips, every ICs forming a different part of the electronic system, without the limits exhibited by the known electric connection techniques, without penalizing the frequency of operation of the system, and there may also be a very high number of signals exchanged between one chip and another. In fact, a solution according to the present invention allows to connect electrically the chips on which the service circuit structures are realized (such as the decoding and selection circuits 260) to one or more chips on which the functional circuit cores are integrated (such as for example the matrixes 220 of memory cells), thanks to the fact that, with the use of the conductive through holes as interconnection means, it is possible to realize a high number (also of the order of a thousand or more) of electric connections between chips, a thing that is practically impossible if conductive wires were used. The system operation speed or the frequency of the operational signals exchanged between a chip and the other through the conductive holes are also not particularly penalized by the fact that different parts of the electronic system are integrated on different chips, a thing that would instead be not possible if connection wires were used.

In other words, while with the known techniques of electric connection of ICs formed on different chips, like, for instance, the connection through wires, separating an electronic system into more subsystems, to be integrated on different chips, would be impractical inasmuch the number of signal lines between the different subsystems is high, and/or the signal switching frequency increases, a reason due to which many subsystems are always integrated in the same chip, these limits are overcome thanks to the present invention.

The structure according to the embodiment of the present invention here described allows to substantially improve the efficiency of the manufacturing process of the electronic system 200, since the parts of the system, such as for instance the service circuit structures 245, that can be manufactured with less expensive and sophisticated apparatuses compared to the parts that constitute the functional circuit cores of the system, are put together in one (or more) service chips (in the considered example the chip $210_4$), while the remaining parts of the system, namely the functional circuit cores, that technologically require more advanced and sophisticated, and therefore more expensive, processes are integrated in stand-alone chips (in the example the chips $210_1$-$210_3$), through dedicated processes, exploiting in more efficient way the photolithographic apparatuses (that should not be under-employed for providing small integration density structures). In this way, the obtainable yield in the manufacturing process of the ICs integrated in every chip is significantly increased.

By putting together the service circuit structures of a generic electronic system in one or more dedicated chips (such as for instance the chip $210_4$), it is also possible to significantly reduce the area occupied by the generic chip (like for instance the generic chip $210_i$ belonging to the plurality $210_t$) in which the functional circuit core of the system is instead integrated. Overall, the electronic system is more compact, and it is therefore adapted to the use in applications in which it is desired to reduce the space occupation.

A further advantage comprises, according to an embodiment of the present invention, it is possible to keep distinguished the functions of the ICs integrated in the various chips that compose the electronic system, thereby reducing possible malfunctionings compared to the case in which the electronic system is integrated on a single chip. The production cost is also reduced in comparison to the SOC solution.

According to an embodiment of the present invention, the chips $210_i$ are provided on a wafer of semiconductor material. After the fabrication, the wafer is diced into the individual chips $210_i$.

After the manufacture, and preferably before assembly, the ICs integrated in the chips $210_i$ are tested with the purpose of verifying their functionality, and particularly to ensure that they are not defective. Particularly, during the testing, information concerning global or local physical failures (such as the undesired presence of short circuits and break-down phenomena) and the operation of every ICs integrated on the chips $210_i$, can in general be revealed, so that only the chips that meet predetermined requisite pass to the following process phases and are assembled to forming the electronic system 200.

Preferably, at least part of the testing of the ICs is performed at the wafer level, before the dicing into chips thereof (the testing at the wafer level is referred to as "Electrical Wafer Sort" or EWS).

For example, in case of non-volatile semiconductor memory devices (like, for instance, in the case of Flash memories) the EWS testing is performed on every chip in which the memory matrix 220 is realized, with the purpose of assessing its correct operation.

According to an embodiment of the present invention, to perform the EWS testing, a test wafer specifically designed for that purpose is used, which during the testing, is laid on the wafer to test. Particularly, the test wafer includes test areas corresponding to every chip $210_i$ to test. In each of such areas, the test wafer includes, in particular, contact pads adapted to be contacted by (mechanical micro)probes used for performing the testing, i.e. for supplying/receiving to/from the IC integrated on the chip to be tested the power supply and the electric signals necessary to the test its functionality. Each contact pad is electrically connected to the through holes of the chips $210_i$ to be tested through further conductive through holes, provided in the test wafer. The conductive through holes provided in the test wafer are arranged in such a way as to coincide, when the two wafers (test wafer and wafer to be tested) are superimposed with those some chips $210_i$ to be tested, in other words the conductive through holes formed in the test wafer follow the configuration of the through holes of the chips $210_i$.

Several variations to the embodiments of the invention just described are possible, as well as several alternative embodiments of the present invention.

Figure 3A:
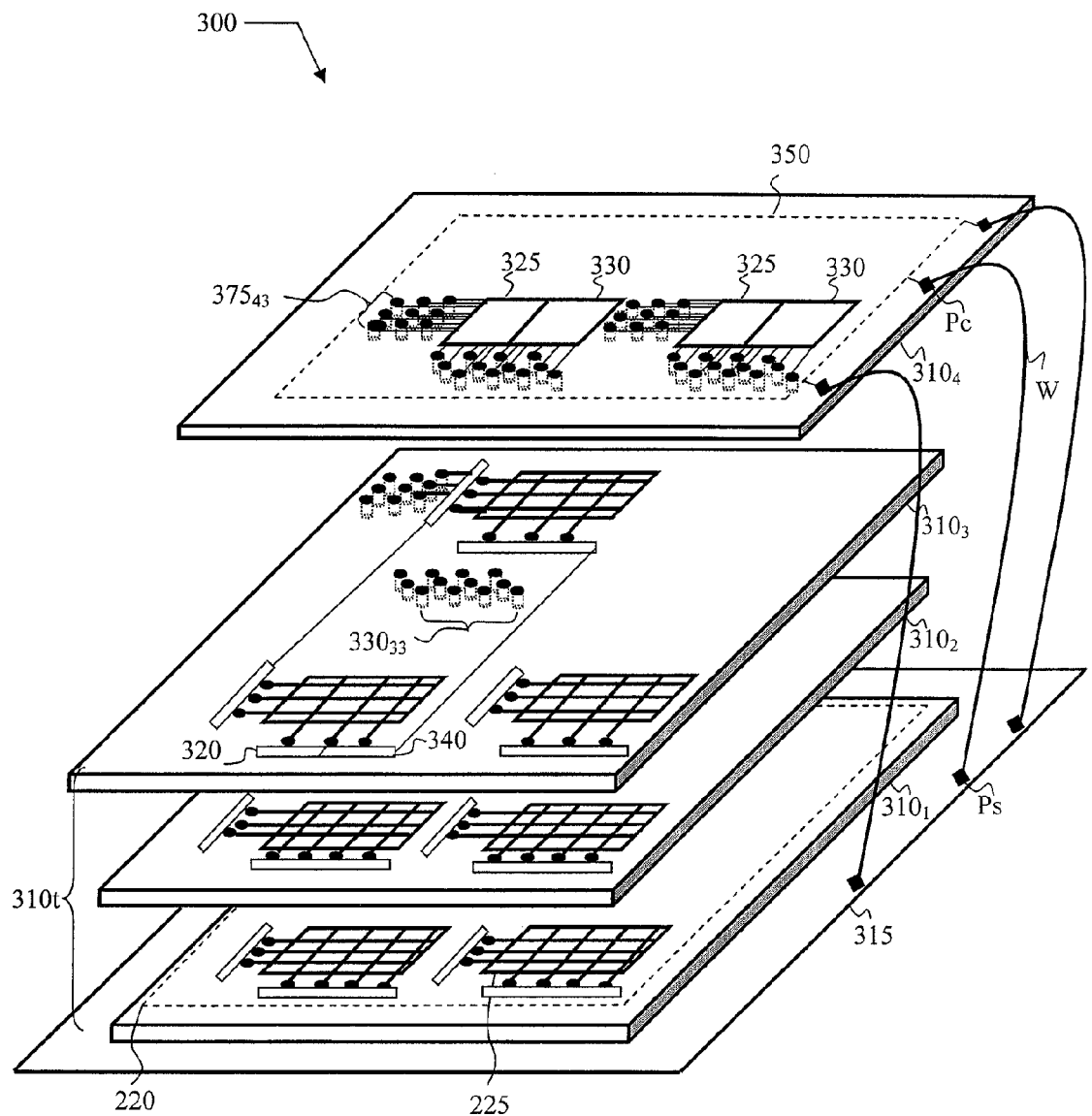
FIG. 3A schematically shows an electronic system according to a further embodiment of the present invention.

An alternative embodiment is shown, always by way of example, in FIG. 3A; an exemplary electronic system 300 includes a plurality of two or more ICs, integrated on respective chips $310_i$ (for i=1 ... n, in the shown example n=4). The chips $310_i$ are in particular stacked one onto the other, as in the previous exemplary embodiment, and they are preferably mounted on a chip support 315.

On every chip $310_i$ respective ICs are integrated, that can include analog and/or digital circuits, and that implement different sub-systems of the electronic system 300.

In the considered example, the electronic system 300 is a memory device; however, this should not be interpreted as limitative of the present invention, since a solution according to the present invention can be applied to any other electronic system that can be implemented using two or more chips (such as, for instance, electronic systems comprising microprocessors, microcontrollers, DSP, as well as any combination of analog and digital ICs, for instance radiofrequency transceiver ICs in combination with memory ICs and/or microcontrollers, microprocessors, DSP ICs).

On every chip, not only electronic circuits can be integrated, but in general systems of various nature (micromechanical systems, microelectro-mechanical systems and electronic system), like MEMS, that combine the electrical/electronic properties of the semiconductor ICs with mechanical, electromechanical and also optical properties. However, in the following description, for brevity it will be assumed that in the various chips $310_i$ only electronic ICs are integrated, and particularly, as already mentioned, IC adapted to realize a memory device.

In the exemplary embodiment of the invention here considered, the plurality of (two or more) stacked chips $310_i$ in which there are integrated the ICs that globally constitute the electronic system 300 includes a chip, in the example the chip $310_4$, placed at the top of the stack, or in general at an end of the stack of chips, and one or more chips, globally denoted as $310_r$, in the example the chips $310_1$-$310_3$, stacked between the support 315 and the end chip $310_4$.

Similarly to what has been described in the foregoing, the ICs integrated in the chips $310_1$-$310_3$ of the memory device 300 include matrixes 220 of non-volatile memory elements, for example of Flash type, arranged in memory sectors 225.

Figure 3B:
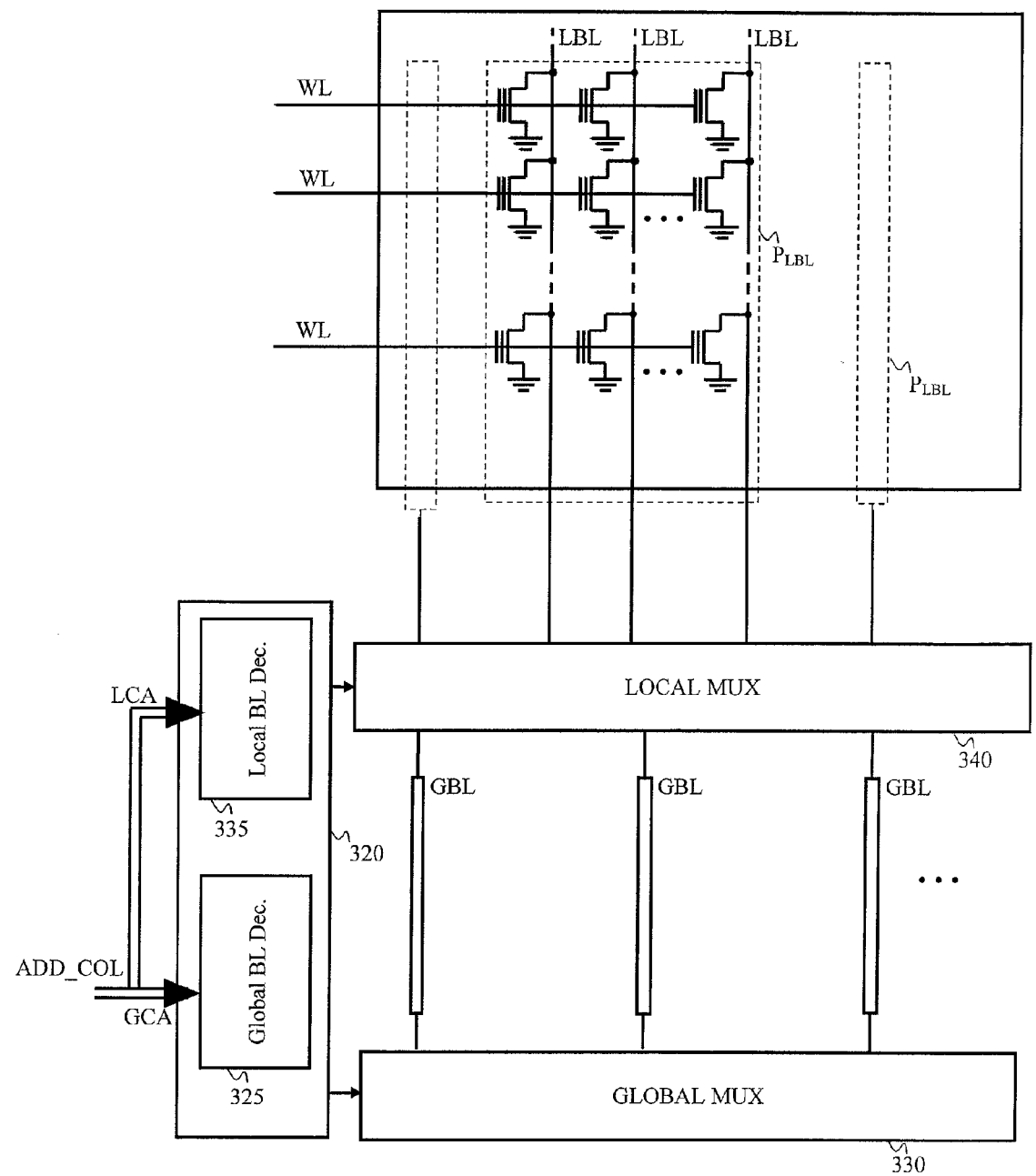
FIG. 3B shows a structure of principle of a memory sector, according to an embodiment of the present invention.

In the considered example, the selection of the columns (bit lines) in the generic memory sector 225 is structured in two hierarchical levels (shown in the circuit scheme of FIG. 3B), an upper or global hierarchical level, formed by global bit lines GBL, and a lower, or local hierarchical level, formed by local bit lines LBLs. To each global bit line GBL there corresponds a packet PLBL of local bit lines LBL, each of which is associated with a respective column of a generic sector 225 of the matrix 220.

A column decoder 320 receives in input an column address ADD_COL and it properly commands the selection of the bit lines BL of the sector 225. The column address ADD_COL is composed of two parts: a global column address GCA and a local column address LCA. The global column address GCA is supplied in input to a global bit line decoder 325 (within the column decoder 320), which is responsible of the addressing of column at a global level. The global bit line decoder 325 commands a global bit line multiplexer 330. The global bit line GBL coupled to the packet of bit lines PLBL, corresponding to the addressed memory cell to select, is therefore selected by the global bit line multiplexer 330.

The local column address LCA is fed in input to local bit line decoder 335 (included in the column decoder 320), which is adapted to drive a local bit line multiplexer 340, for discriminating the bit line BL to be selected within the packet of local bit lines 315 corresponding to the selected global bit line GBL.

Similarly to what described for the bit lines BL, also the selection of the word lines is or can be structured on two hierarchical levels. Particularly, an upper or global hierarchical level, formed by global word lines, and a lower, or local hierarchical level, formed by local word lines connected to the memory cells. Also in this case, in the memory device 300 decoding and multiplexing circuits are provided (not shown in the drawing for the sake of simplicity) of the signals used for performing the selection of the desired cells.

According to an embodiment of the present invention, the chips $310_1$-$310_3$ include, for every memory sector 225, the circuits for decoding the local columns and/or rows (for example, in FIG. 3A there are shown the local column decoder 320 and the local column multiplexer 340). A global decoder 350 is integrated in the chip $310_4$ and comprises the circuits (like for instance a plurality of global bit line decoders 325 and a plurality of global multiplexer 330 each corresponding to the sectors 225) necessary for the selection of the global bit lines GBL and of the global word lines. The global decoder 350 is used for the selection of the memory cells included in all the chips $310_1$-$310_3$.

To such end, the local decoding circuits integrated in the generic chip $310_1$-$310_3$ are connected, through groups of conductive through holes $330_{in}$ (in the drawing only some through holes $330_{33}$ related to the chip $310_3$ are shown, for the sake of clarity), to corresponding groups of conductive through holes 375 in formed in the chip $310_4$, thereby providing the inter-chip electric connections between all the chips of the stack. Particularly, to connect the local decoding circuits of chips that are not adjacent to the chip $310_4$ there are provided, similarly to the case of FIG. 2, intermediate through holes (not shown in the drawing) formed in the intermediate chip or chips between the two non-adjacent chips.

It is noted that, according to an embodiment of the present invention, the service chip $310_4$ can have smaller dimensions compared to the remaining chips $310_1$-$310_3$ of the stack, since part of the decoding circuits are locally integrated in the chips $310_1$-$310_3$.

Additionally, to further reduce the dimensions of the service chip $310_4$, the through holes $330_{in}$ and the corresponding $375_{in}$ can be realized in such a way as to occupy one predetermined zone of every chip $310_i$. In the considered example, the groups of through holes $330_{in}$ and the groups of intermediate holes of every chip $310_i$ are formed along the edges of the chips $310_i$, for example adjacent to the sectors 225 integrated in the corners of the chips shown in the drawing. Strips in metal or other conductive material connect a plurality of decoding and selection signal terminals of the column and/or row local decoding circuits (for example, local column decoder 320 and the local column multiplexer 340) to the corresponding through holes $330_{in}$. The chip $310_4$ is placed so that the groups of through holes 375 in coincide with the correspondings through holes $330_{in}$, in such a way as to provide the inter-chip electric connections (and therefore in correspondence of the through holes of every chip with which it is desired to accomplish the inter-chip electric connection).

According to an embodiment of the present invention, to perform the EWS testing, a test wafer comprising the service chip is used. During the testing, the test wafer is supported on the wafer to be tested comprising the chips $310_i$ belonging to the plurality $310_r$. Particularly, the contact pads of the service chips are adapted to be contacted by (mechanical micro) probes used for performing the test, i.e. for supplying/receiving to/from the IC integrated on the chip to be tested the supplies and the electric signals necessary to test the functionality, so that it is possible to exploit as test wafer, the wafer containing the service chips.

Each contact pad is electrically connected to the through holes of the chips $310_i$ to be tested through the conductive through holes. The conductive through holes provide in the test wafer are arranged so as to coincide, when the two wafers are superimposed, with those of the chips $310_i$ to be tested, and particularly the test is performed by enabling the test signals necessary to perform the test.

It is noted that the structure according to the present invention allows to substantially improve the efficiency of the manufacturing process of the electronic system 300, since its service sub-systems are at least partially put together, on a single chip, and they are shared during the operation of the electronic system 300 by the ICs integrated in the chips comprising the memory matrices. In this way, the integration in the service chip of the global decoding system can be obtained using less expensive and sophisticated apparatuses compared to those that need to be used for forming the remaining sub-systems of the memory device 300 (which require more expensive and sophisticated processes). Accordingly, the obtainable yield of the manufacturing process of the ICs integrated on every chip is significantly increased.

Additionally, the fact that the ICs integrated in respective chips use at least partially the same service circuit structures, allows reducing the size of the electronic system compared to conventional SIPs. This is particularly advantageous in applications related to portable electronic devices, like for instance cellular phones, electronic computers and storage devices (for example USB drivers).

Figure 4:
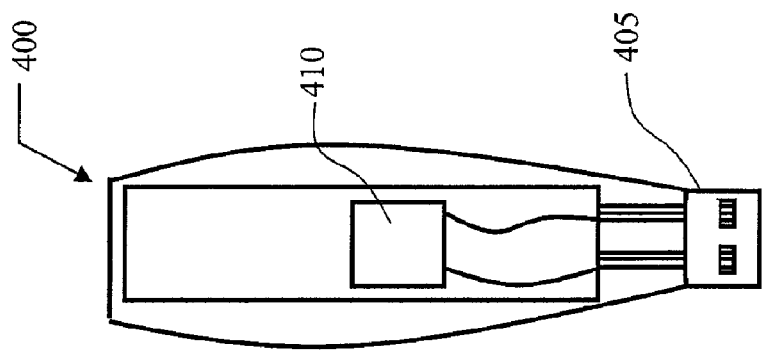
FIG. 4 shows an exemplary application scenario of an electronic system according to an embodiment of the present invention.

An example of application of an embodiment of the present invention is shown in FIG. 4, that depicts a portable USB device 400 with a USB connector 405 adapted to be plugged into a USB port, for example of an electronic computer, and comprising a memory device 410, particularly a memory device according to an embodiment of the present invention.

In alternative embodiments of the present invention, it is possible to implement an electronic system comprising more stacked chips interconnected using through holes as described above, and every ICs of the chip could be realized with a dedicated process flow and have its own function. The chips are then connected using through holes so as to meet the application requirements (electrical and/or mechanical).

Figure 5:
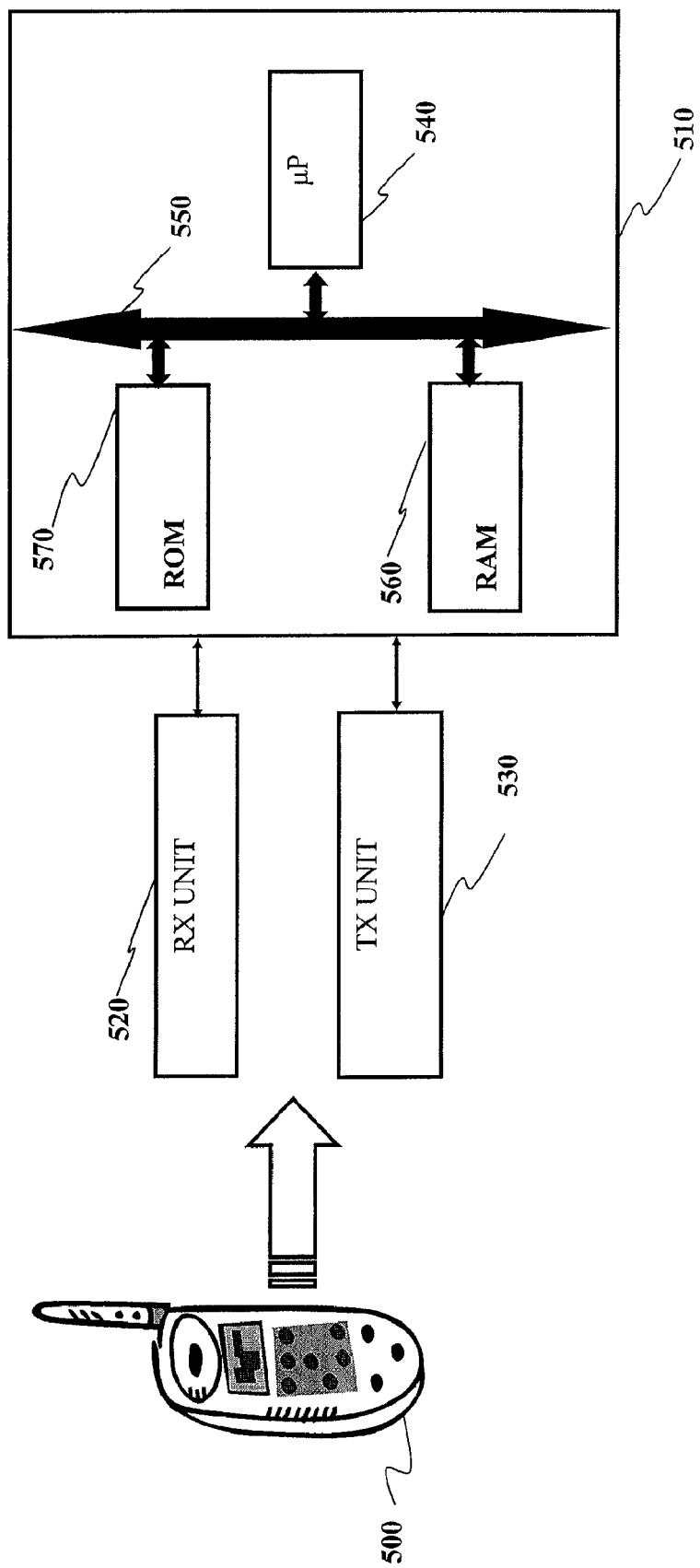
FIG. 5 shows another exemplary application scenario of an electronic system according to an embodiment of the present invention.

With reference to FIG. 5, there is shown an exemplary scenario in which an electronic system comprising more stacked chips interconnected as described above can be used, according to an embodiment of the present invention. Particularly, the considered scenario is that of a mobile communication system in which users provided with mobile communication terminals 500 (cellular phones) can communicate with each other. The internal circuitry of the mobile terminal 500 includes a processing unit 510, that is used in combination with a receiving unit 520 and a transmitting unit 530 to perform the digital processing of the data in base band, as required by the specific protocol used. The receiving unit 520 and the transmitting unit 530 schematically represent the radiofrequency system of the mobile terminal 500. The processing unit 510 includes a microprocessor 540, a system bus 550, a RAM memory 560 and a ROM memory 570. Particularly, the RAM memory 560, the ROM 570 and the microprocessor 540 can be assembled in a single module in which the service structures necessary for the operation of the electronic system are integrated on a chip and are shared by all the operational functional cores without the necessity of duplicating such structures. In this way, according to an embodiment of the present invention, the functional and/or topological areas that need dedicated process flows (more expensive and sophisticated) are put together. The same occurs for those structures that require less expensive and less sophisticated process flows, thereby achieving an improvement of the production yield.

Naturally, to the above described solution one skilled in the art may bring changes and variations, with the purpose of satisfying contingent and specific requirements. Particularly, although the present invention has been described with reference to its preferred embodiments, it is clear that various omissions, substitutions and changes in the form and in the details, as well as other embodiments are possible; it is also expressly understood that specific elements and/or method steps described in connection with each described embodiment of the invention can be incorporated in any other embodiment, as a normal matter of choice.

For example, although in the preceding description reference has been made to a system in which the chip placed at the top of the stack of chips comprises only the service circuitries, it is possible that this chip also includes other circuits, for example matrices of memory cells.

Additionally, it is possible that the chip containing the service structures an intermediate position within the stack of chips.

Moreover, it is possible that in alternative embodiments of the present invention the chips of the pluralities $210_t$ and $310_t$ have dimensions different from each other.

What is claimed is:

1. An electronic system adapted to perform a corresponding function and comprising at least a first subsystem and a second subsystem, the first subsystem and the second subsystem being operatively coupled to each other through a plurality of electric connections to perform the function of the system, the first subsystem and the second subsystem are respectively integrated on a first material chip and on a second material chip, and said plurality of electric connections includes a plurality of conductive through holes provided in at least one of said first and second chips and adapted to provide a corresponding plurality of chip-to-chip electric connections when the first and the second chips are superimposed, wherein
a required lithographic patterning resolution for at least some elements in one of the first or second subsystems is higher than a highest patterning resolution for the other one of the first or second subsystems.

2. The electronic system according to claim 1 incorporated in a cell phone.

3. The electronic system according to claim 1, in which said conductive through holes are adapted to transfer operational signals used for performing said function.

4. The electronic system according to claim 3, comprising at least a third subsystem integrated on a third material chip, said third chip occupying a space comprised between said first chip and said second chip, third conductive through holes on the third chip being provided for electrically joining said first subsystem with said second subsystem.

5. The electronic system according to claim 1, in which said plurality of conductive through holes includes first conductive through holes provided in the first chip and second conductive through holes provided in the second chip, the first and the second through holes being arranged so that, when the first subsystem and the second subsystem are operatively coupled, each first through hole is in a one to one relationship with a corresponding second through hole.

6. The electronic system according to claim 1, in which the first subsystem and the second subsystem respectively include a first integrated circuit and a second integrated circuit, said first integrated circuit comprising a memory cells matrix and said second integrated circuit comprising circuits of management of the access to the memory cells matrix.

7. The electronic system according to claim 6, in which the memory cells matrix includes at least one sector in which the memory cells are arranged in rows and columns, and the circuits of management include a decoding system adapted to access the memory cells of the matrix in response to an address code received from the outside, the decoding system comprising a plurality of row address decoding and selection blocks and a plurality of column address decoding and selection blocks adapted to select the rows and the columns of the at least one sector through the operational signals exchanged through the first through holes and the second through holes.

8. The electronic system according to claim 6, in which the rows and the columns of the at least one sector are grouped in at least two subgroups, every subgroup being addressable by a corresponding global decoder and every row and/or every column of every subgroup being addressable by a local decoder, said first integrated circuit comprising at least one local decoding system associated with the at least one sector of the matrix and said second integrated circuit comprising at least one global decoding system associated with the at least one sector of the matrix.

9. The electronic system according to claim 1, comprising a support adapted to sustain the first chip.

10. The electronic system according to claim 9, in which the support for chip includes a plurality of first contact pads and the second chip includes a plurality of second contact pads, the first contact pads being connected to respective second contact pads through conductive connection wires.

11. The electronic system according to claim 1, comprising a support for chip adapted to sustain the second chip, the support for chip comprising a plurality of first contact pads and the second chip comprising a plurality of through holes, said plurality of through holes being adapted to be electrically connected to the first contact pads.

12. An electronic apparatus that comprises an electronic system according to claim 1.

13. A stacked multi-chip circuit comprising:
a first integrated circuit configured to provide a first system functionality, the first integrated circuit being formed on a first chip and including a plurality of conductive through holes extending through the first chip; and
a second integrated circuit configured to provide a second system functionality, the second integrated circuit being formed on a second chip and including a plurality of conductive contacts aligned with the plurality of conductive through holes on the first chip, wherein
the second chip is adjacent the first chip and the conductive contacts are electrically coupled to the conductive through holes, and
a required lithographic patterning resolution for at least some elements in one of the first or second integrated circuits is higher than a highest patterning resolution for the other one of the first or second integrated circuits.

14. The multi-chip circuit of claim 13, wherein the first integrated circuit is fabricated according to a first manufacturing process and the second integrated circuit is fabricated according to a second manufacturing process that is different from the first manufacturing process and incapable of fabricating the first integrated circuit.

15. The multi-chip circuit of claim 13, wherein at least one of the conductive through holes is adapted to transfer operational signals between the first chip and a second chip.

16. The multi-chip circuit of claim 13, further comprising a third chip having a third integrated circuit, wherein at least one of the conductive through holes is adapted to transfer operational signals between the first chip and the third chip or the second chip and the third chip.

17. The multi-chip circuit of claim 16, wherein the first chip is between the second and third chips.

18. The multi-chip circuit of claim 13, wherein the conductive through holes are connected to the conductive contacts by bump bonding.

19. The multi-chip circuit of claim 13, wherein the first integrated circuit includes first circuit elements and the second integrated circuit includes service circuit elements for servicing the first circuit elements.

20. The multi-chip circuit of claim 19, wherein the first circuit elements include memory elements.

21. The multi-chip circuit of claim 19, further comprising a third integrated circuit configured to provide the first system functionality, the third integrated circuit being formed on a third chip and electrically coupled to the second integrated circuit, wherein the third integrated circuit includes third circuit elements and a plurality of conductive through holes extending through the third chip and the service circuit elements also service the third circuit elements.

22. The multi-chip circuit of claim 13 disposed in a memory device, a digital signal processor, a microprocessor, or a microcontroller.

* * * * *

UNITED STATES PATENT AND TRADEMARK OFFICE
CERTIFICATE OF CORRECTION

PATENT NO. : 8,228,684 B2  
APPLICATION NO. : 12/116852  
DATED : July 24, 2012  
INVENTOR(S) : Aldo Losavio et al.

Page 1 of 1

It is certified that error appears in the above-identified patent and that said Letters Patent is hereby corrected as shown below:

Col. 1, line 44, should read:
terms of achievable yield in the manufacturing process. Addi- Col. 6, line 7, should read:
umns, each one connected to a corresponding bit line BL.

Signed and Sealed this
Eighteenth Day of September, 2012

David J. Kappos
*Director of the United States Patent and Trademark Office*